(12) United States Patent
Chen et al.

(10) Patent No.: US 9,337,859 B2
(45) Date of Patent: May 10, 2016

(54) METHOD AND SYSTEM FOR ASYNCHRONOUS SUCCESSIVE APPROXIMATION ANALOG-TO-DIGITAL CONVERTOR (ADC) ARCHITECTURE

(71) Applicant: MaxLinear, Inc., Carlsbad, CA (US)

(72) Inventors: Xuefeng Chen, Carlsbad, CA (US); Kok Lim Chan, Carlsbad, CA (US); Eric Fogleman, San Marcos, CA (US); Sheng Ye, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 14/812,327

(22) Filed: Jul. 29, 2015

(65) Prior Publication Data

US 2016/0006450 A1    Jan. 7, 2016

Related U.S. Application Data

(63) Continuation of application No. 13/945,579, filed on Jul. 18, 2013, now Pat. No. 9,124,291.

(60) Provisional application No. 61/673,219, filed on Jul. 18, 2012.

(51) Int. Cl.
| | | |
|---|---|---|
| *H03M 1/10* | (2006.01) | |
| *H03M 1/38* | (2006.01) | |
| *H03M 1/06* | (2006.01) | |
| *H03M 1/12* | (2006.01) | |
| *H03M 1/46* | (2006.01) | |

(52) U.S. Cl.
CPC .............. *H03M 1/38* (2013.01); *H03M 1/0682* (2013.01); *H03M 1/125* (2013.01); *H03M 1/466* (2013.01)

(58) Field of Classification Search
CPC ..... H03M 1/38; H03M 1/125; H03M 1/0682; H03M 1/466
See application file for complete search history.

(56) References Cited

U.S. PATENT DOCUMENTS

| | | |
|---|---|---|
| 4,733,220 A | 3/1988 | Knierim |
| 5,034,967 A | 7/1991 | Cox et al. |
| 5,764,710 A | 6/1998 | Cheng et al. |
| 6,225,937 B1 | 5/2001 | Butler |
| 6,369,737 B1 | 4/2002 | Yang et al. |
| 7,356,789 B2 | 4/2008 | Ly et al. |
| 7,492,302 B2 | 2/2009 | Poulton |
| 7,630,464 B1 | 12/2009 | Deboes et al. |
| 8,471,754 B2 | 6/2013 | Yamamoto et al. |
| 8,482,449 B1 | 7/2013 | Zabroda |
| 8,872,691 B1 | 10/2014 | Stepanovic |

(Continued)

*Primary Examiner* — Peguy Jean Pierre (74) *Attorney, Agent, or Firm* — McAndrews, Held & Malloy, Ltd.

(57) ABSTRACT

Methods and systems are provided for controlling signal processing outputs. In signal processing circuitry, searching through a plurality of quantization levels for a quantization level that matches an analog input, and when the search fails within a particular amount of time, adjusting at least a portion of an output of the signal processing circuitry. The adjusting comprises setting the at least portion of the output to a predefined value. Setting the output, or portions thereof, may comprise selecting between output of a normal processing path and output of a code generation path configured for handling search failures. Timing information may be generated for use in controlling generating of the output of the signal processing circuitry. The timing information may be used in measuring per-cycle operation time during the search through the plurality of quantization levels.

20 Claims, 8 Drawing Sheets

(56) References Cited

U.S. PATENT DOCUMENTS 8,957,802 B1 2/2015 Evans
2010/0082589 A1* 4/2010 Mogi .................... H03M 7/24
 707/706
2010/0141499 A1 6/2010 Mathe

* cited by examiner

METHOD AND SYSTEM FOR ASYNCHRONOUS SUCCESSIVE APPROXIMATION ANALOG-TO-DIGITAL CONVERTOR (ADC) ARCHITECTURE

CLAIM OF PRIORITY

This patent application a continuation of U.S. patent application Ser. No. 13/945,579, filed Jul. 18, 2013, which in turn makes reference to, claims priority to and claims benefit from the U.S. Provisional Patent Application Ser. No. 61/673,219, filed Jul. 18, 2012. Each of the above identified applications is hereby incorporated herein by reference in its entirety.

TECHNICAL FIELD

Aspects of the present application relate to communications. More specifically, certain implementations of the present disclosure relate to asynchronous successive approximation analog-to-digital convertor (ADC) architecture.

BACKGROUND

Existing methods and systems for performing digital-to-analog conversions may be costly, cumbersome and inefficient—e.g., they are complex and/or time consuming, require considerable power, and/or may introduce errors or distortion. Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for an asynchronous successive approximation analog-to-digital convertor (ADC) architecture, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Certain implementations of the invention may be found in method and system for an asynchronous successive approximation analog-to-digital convertor (ADC) architecture. As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
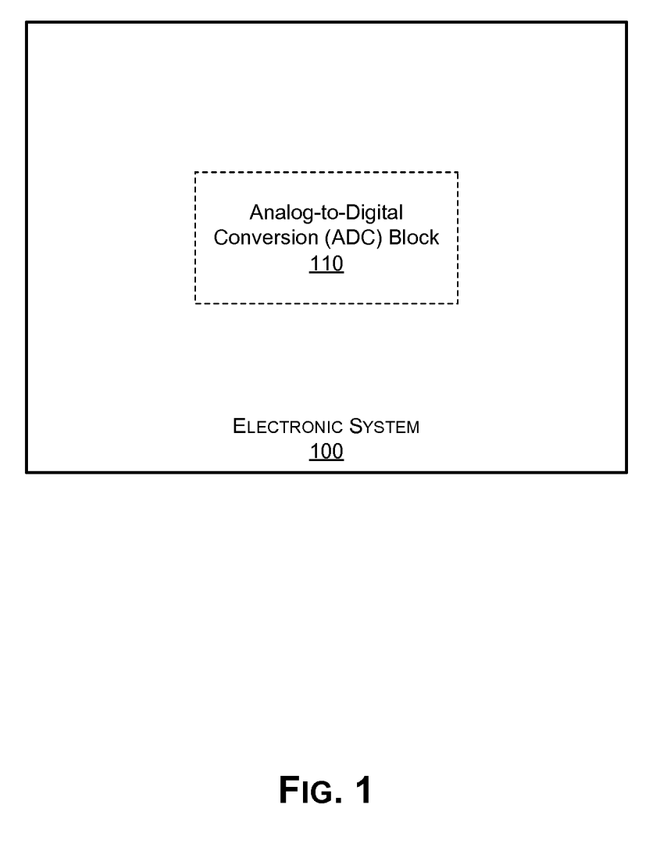
FIG. 1 illustrates an example electronic system that may be operable to perform analog-to-digital conversions.

FIG. 1 illustrates an example electronic system that may operable to perform analog-to-digital conversion. Referring to FIG. 1, there is shown an electronic system 100.

The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or audio content, gaming, communication applications or services (e.g., Internet access/browsing, email, text messaging, chatting and/or voice calling services), and/or networking services (e.g., WiFi hotspot, Bluetooth piconet, and/or active 3G/femtocell data channels).

In some instances, the electronic system 100 may be configured to enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols. Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 250 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may be needed for controlling services provided by the electronic system 100 (e.g., to allow operators to provide input or commands for controlling location specific marketing, or obtain output or feedback pertaining to it). In this regard, the electronic system 100 may comprise components or subsystems for enabling interactions with a user (e.g., end-user or installer), so as to obtain user input and/or to provide user output.

The electronic system 100 may be a stationary system (i.e. being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), set-top boxes (STBs) or other similar receiver systems, and the like. The disclosure, however, is not limited to any particular type of electronic system.

In operation, the electronic system 100 may be operable to perform various operations, functions, applications and/or services. In this regard, in some instances, performing the various, operations, functions, application or services supported by the electronic system 100 may entail performing various processing operations on data handled by the electronic system 100. For example, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme. Accordingly, handling of digital communications may typically require performing, among other things, digital-to-analog conversion (e.g., via an analog-to-digital conversion (ADC) block 110) at the transmitting end and analog-to-digital conversion at the receiving end. In this regard, analog-to-digital conversion (ADC) block 110 may comprise circuitry, interfaces, logic and/or code for performing analog-to-digital conversions.

In some instances, analog-to-digital conversions may be complex, may be time consuming, may require considerable power, and/or may introduce errors or distortion. Various types of analog-to-digital convertors may be used in performing the analog-to-digital conversions. For example, some systems may be configured to utilize asynchronous successive approximation based analog-to-digital converter (ADC). A successive approximation ADC may be configured to convert a continuous analog waveform into a discrete digital representation based on binary search through all possible quantization levels before finally converging upon a digital output for each conversion. One example of successive approximation ADCs is the asynchronous successive approximation register (SAR) ADC, which utilizes a register for storing binary values that may be used in the successive approximation search. In this regard, the values stored in the register may be converted to analog signals (via a digital-to-analog convertor (DAC) component), and used in the approximation search (e.g., as quantization values with which received analog signals, or portions thereof, may be matched). For an asynchronous successive approximation register (SAR) analog-to-digital converter (ADC), the time for conversion of each bit/stage may depend on the time the digital-to-analog converter (DAC) component used in it settles. In this regard, when the input and the threshold (used in matching quantization values) are close, such settling may take a long time, resulting in distortion or errors.

Accordingly, in various implementations in accordance with the present disclosure, ADCs (particularly ADCs using successive approximation, such as SAR ADCs) may be configured to detect and/or compensate for delays resulting from unsettled matches. For example, in an example implementation, one or more circuits may be incorporated into the ADC, to detect for unsettled matches and/or to force each stage to settle within a particular time period (e.g., $T_{Max}$). The time period ($T_{Max}$) may be preconfigured, or may be adaptively determined and/or set. For example, at power up, or during factory test, the settling timeout $T_{MAX}$ may be measured as the time it takes the DAC to settle to within 1 LSB of error (i.e. $T_{MAX}$ is calibrated to account for process variations). The determined value of $T_{MAX}$ may then be programmed into the chip or system.

In an example implementation, a timer circuit may be incorporated and used in measuring how long stage(s) take to settle—e.g., measuring settlement time by an RF clock or some other clock that may be faster than the ADC clock. The time the stage takes to settle may provide information about the signal (i.e., faster settling indicates that the signal is much higher than the threshold, and slower settling indicates the signals are close). Accordingly, in instances where the time indicates that the signals are very close, one or more stages of conversion may be skipped. In some instances, the signal is much higher than the threshold, and it will likely be significantly higher than the next threshold such that the conversion time of the stage being skipped may be almost negligible. Skipping many stages, however, may result in saving more time.

Figure 2:
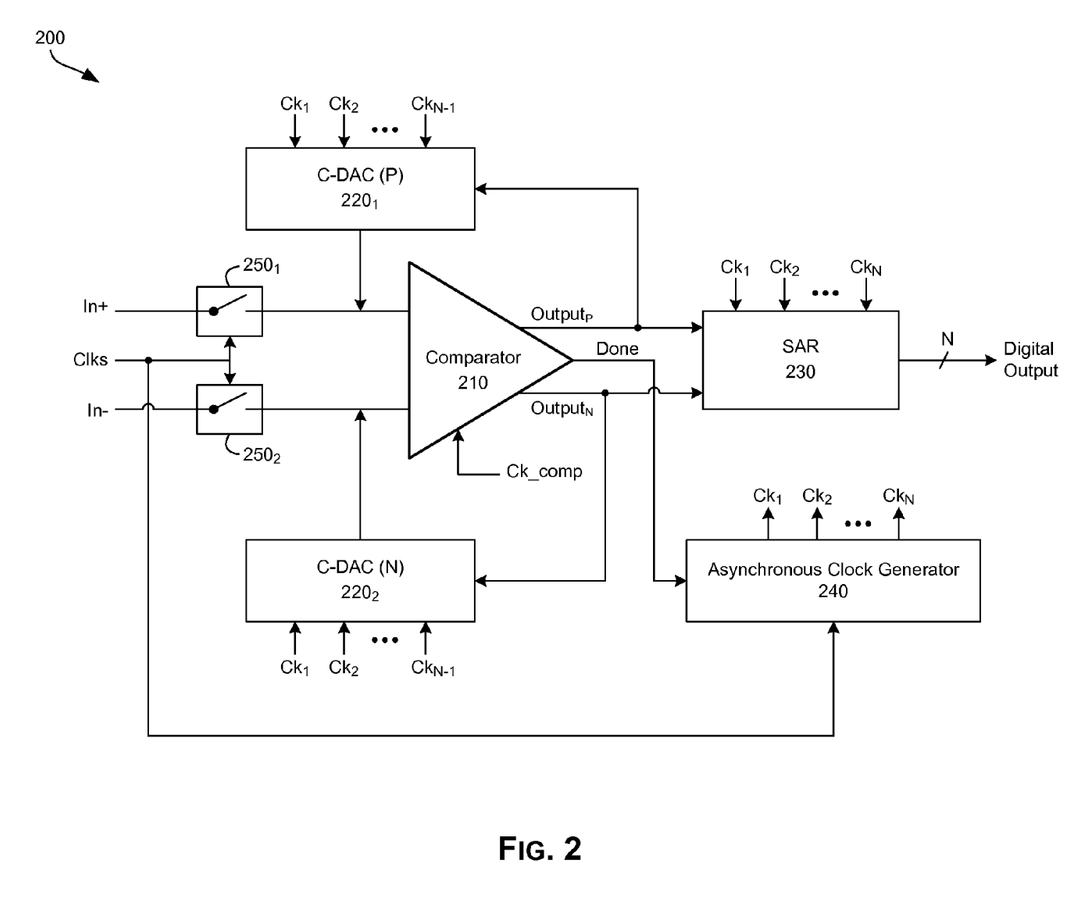
FIG. 2 illustrates an example conventional asynchronous successive approximation register (SAR) analog-to-digital converter (ADC).

FIG. 2 illustrates an example conventional asynchronous successive approximation register (SAR) analog-to-digital converter (ADC). Referring to FIG. 2, there is shown an asynchronous successive approximation register (SAR) analog-to-digital converter (ADC) 200.

The asynchronous SAR ADC 200 may comprise suitable circuitry, interfaces, logic and/or code operable to provide sampling and analog-to-digital conversions. In this regard, the asynchronous SAR ADC 200 may be incorporated into an electronic system (e.g., the electronic system 100 of FIG. 1) to provide analog-to-digital conversions therein—i.e. the asynchronous SAR ADC 200 may correspond to at least a portion of the ADC block 110. The asynchronous SAR ADC 200 may be configured to perform analog-to-digital conversions in accordance with successive approximation techniques, whereby converting continuous analog signals into discrete digital representations may be done based on a binary search, through all possible quantization levels for example, before finally converging upon a digital output for each conversion. For example, the asynchronous SAR ADC 200 may generate, based on input analog signal(s), a digital output having a particular resolution (e.g., N, with 'N' being a non-zero natural number), that corresponds to the number of bits in the digital output. Commonly, the resolution of SAR ADCs range from 8 to 26 bits, but the disclosure is not necessarily limited in this regard.

In some instances, asynchronous SAR ADCs, such as the asynchronous SAR ADC 200, may use internal clock signals, which may vary from the other clocks used in chips comprising the ADCs (e.g., the chip overall clock), even in instances where the asynchronous SAR ADC's clock(s) may be derived from these clocks (e.g., from the chip overall clock).

For example, as shown in FIG. 2, the asynchronous SAR ADC 200 may comprise, for example, a comparator 210, negative and positive cascade digital-to-analog convertors (C-DACs) $220_1$ and $220_2$, a successive approximation register (SAR) 230, an asynchronous clock generator 240, and switching elements $250_1$ and $250_2$.

The comparator 210 may comprise circuitry, interfaces, logic and/or code operable to generate one or more output signals based on comparison of two input signals. Comparing operation in the comparator 210 may be controlled by use of dedicated clocking signal Ck_comp. In this regard, comparisons may only be performed when the Ck_comp signal is deasserted.

Each of the C-DACs $220_1$ and $220_2$ may comprise circuitry, interfaces, logic and/or code operable to provide an analog voltage equivalent of particular digital code (e.g., corresponding to output of the SAR 230). In this regard, each of the C-DACs $220_1$ and $220_2$ may be configured to function in accordance with charge scaling techniques. For example, each of the C-DACs $220_1$ and $220_2$ may comprise a plurality of capacitors—e.g., the same number as the SAR ADC's resolution (i.e., N). The charge (and thus the analog signal outputted by each of the C-DACs $220_1$ and $220_2$) may then be built up incrementally by turning on the inputs to the capacitors in a controlled manner (e.g., one-by-one, after some delay between each two consecutive capacitors). For example, the internal clock signals $Ck_1$ to $Ck_{N-1}$ may be used to incrementally charge up the capacitors, with the last capacitor, corresponding to the most significant bit (MSB), being charged up initially. This may allow scaling the internal signal compared against the input analog signal incrementally.

The SAR 230 may comprise suitable circuitry, interfaces, logic and/or code operable to record and store outcomes of bit-wise comparisons performed in the asynchronous clock generator 240, which may then be provided as a digital output equivalent of the input analog signal. In this regard, the SAR 230 may comprise an N-bit register, with each of these N bits being set to logic high (i.e., '1') or logic low (i.e., '0') based on corresponding output from the comparator 210. For example, during operations, each bit, starting from the MSB may initially be set to logic 2, and then a search may then be done down to the least significant bit (LSB), with each bit being reset to logic 0 when the corresponding output from comparator 210 is a logic low. Once all comparisons are done (i.e., the LSB is reached), the conversion may be complete and the N-bit digital output may be available from the SAR 230.

The asynchronous clock generator 240 may comprise suitable circuitry, interfaces, logic and/or code operable to generate clocking signals for controlling operations in the asynchronous SAR ADC 200. In particular, the asynchronous clock generator 240 may generate a plurality of internal clock signals $Ck_1$-$Ck_N$ (N being the ADC's resolution), based on an overall clocking signal (Clks) provided to the asynchronous SAR ADC 200 (e.g., the global chip clock) and the comparator clock signal, Ck_comp. The overall clocking signal Clks may also drive operations of the switching elements $250_1$ and $250_2$, which allows forwarding of the input voltage (corresponding to the analog input) to the comparator 210. For example, switching elements $250_1$ and $250_2$ may be closed (switched on) to pass the input voltage when the overall clocking signal Clks is asserted.

Figure 3A:
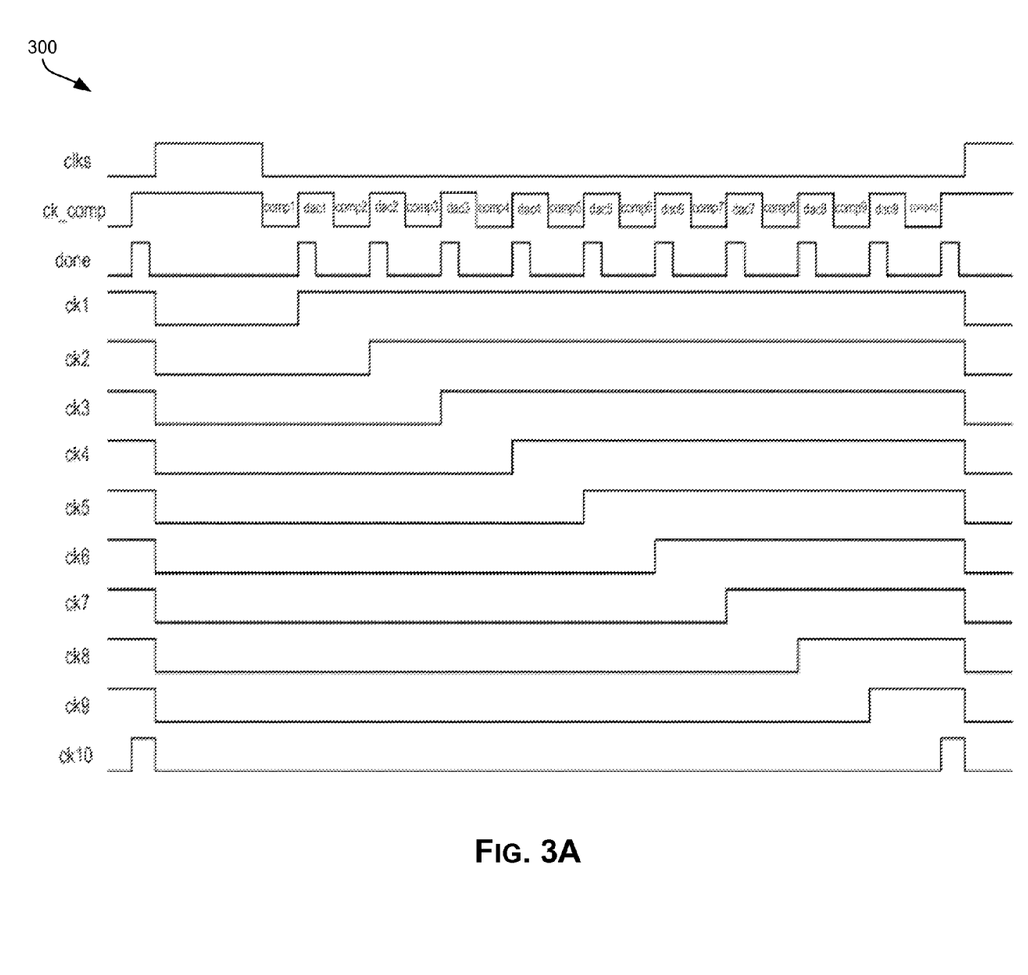
FIG. 3A illustrates an example nominal timing diagram corresponding to normal operation conditions in conventional asynchronous successive approximation register (SAR) analog-to-digital converter (ADC).
Figure 3B:
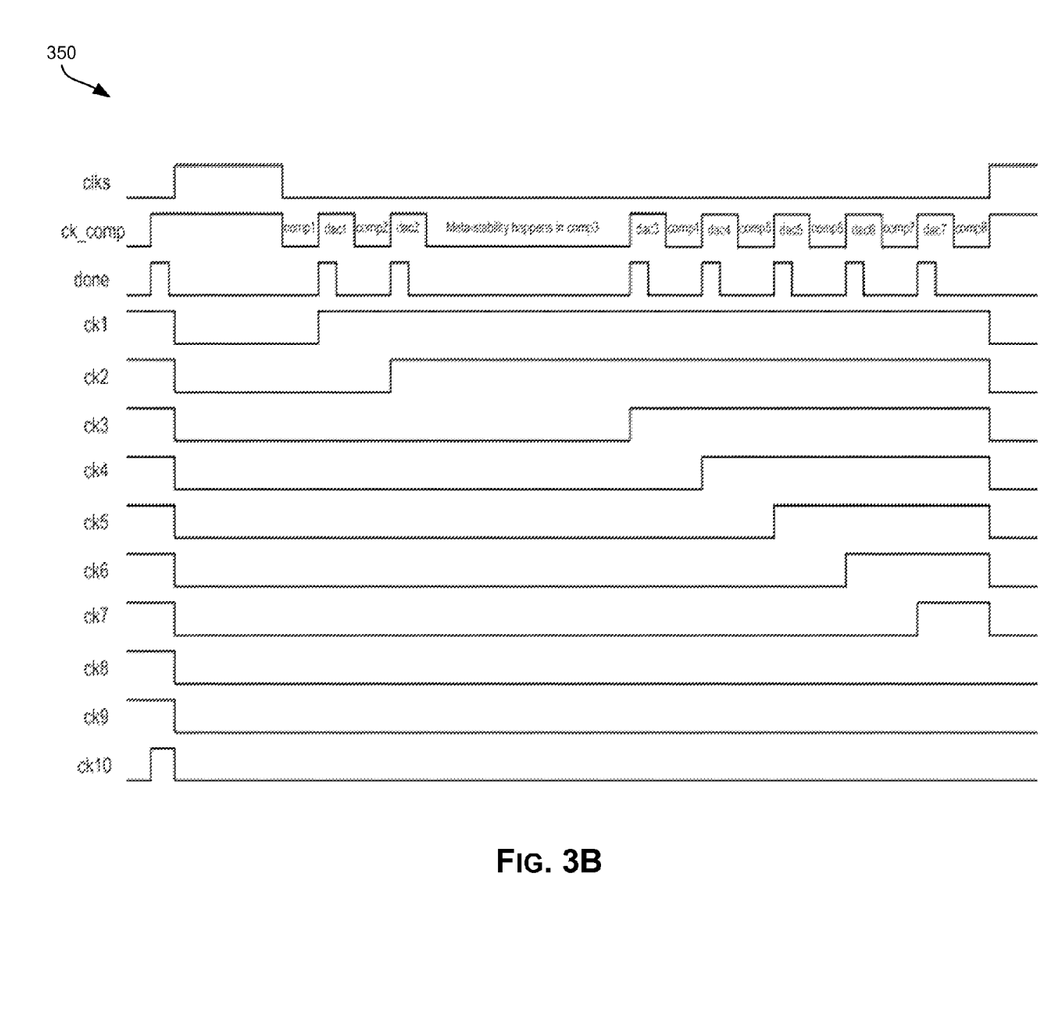
FIG. 3B illustrates an example timing diagram during a possible meta-stability event in a conventional asynchronous successive approximation register (SAR) analog-to-digital converter (ADC).

In operation, the SAR ADC 200 may be operable to perform analog-to-digital conversions, and to particularly do so in an asynchronous successive approximation manner. The SAR ADC 200 may be configured to, for example, convert a continuous analog waveform (corresponding to analog input signal) into a discrete digital representation based on a binary search through all possible quantization levels before finally converging upon a digital output for each conversion. The binary values, used in the successive approximation search, may be initially set, and may be fed into the each of the C-DACs $220_1$ and $220_2$. In this regard, the binary values may be defined as threshold values (e.g., voltages) corresponding to digital values '0' and '1'. The C-DACs $220_1$ and $220_2$ may then be used to apply the analog equivalents of the quantization levels to the inputs of the comparator 210, for comparison with the sampled input signals (e.g., voltages). In this regard, the C-DACs $220_1$ and $220_2$ may be configured to apply the analog equivalents for the different levels between the binary values in an incremental fashion. For example, in instances where the C-DACs $220_1$ and $220_2$ are implemented as capacitor arrays, the charge (and thus the analog signal) applied by each of the C-DACs $220_1$ and $220_2$ may be built up incrementally by turning on the inputs to the capacitors in a controlled manner—e.g., by using the clock signals $Ck_1$ to $Ck_{N-1}$ to incrementally charge up the first N−1 capacitors (with the last capacitor, corresponding to the most significant bit (MSB) being charged initially). In this regard, the asynchronous clock generator 240 may be configured to generate the clock signals $Ck_1$-$Ck_N$ so that the separation between these clocking signals is set to provide the desired incremental buildup of the charge (i.e., application of analog equivalent of binary values) of the C-DACs $220_1$ and $220_2$. For example, the comparator 210 may issue a 'Done' indication signal whenever an approximation stage (for a particular bit) is complete—i.e., an equivalent discrete value has been determined. The asynchronous clock generator 240 may then issue the next clock signal $Ck_i$. The output of the comparison/matching performed by the comparator 210 may then be incrementally stored into the SAR 230, with the resulting code stored therein corresponding to the digital approximation (e.g., for every N bits) of the sampled input analog signal. The digital output may be outputted by the SAR 230 at the end of every approximation cycle (i.e. for every N-bit sequence). In some instances, however, approximation for a particular stage (e.g., corresponding to particular bit) may introduce errors, such as when meta-stability events occur during approximation cycle. In this regard, in the case of a meta-stability event, an approximation stage (for particular bit) may not settle, such as when the input analog signal, corresponding to the particular bit, may be too close to the quantization threshold. In other words, the comparator 210 may take too long (e.g., up to the end of the time allocated for each N-bit approximation cycle) to approximate the discrete equivalent of a particular bit (thus resulting in the remaining bits in the corresponding N-bit sequence being erroneously set). FIGS. 3A and 3B depict example timing corresponding to normal operation and the case of a meta-stability event, respectively, during use of the SAR ADC 200.

FIG. 3A illustrates an example nominal timing diagram corresponding to normal operation conditions in conventional asynchronous successive approximation register (SAR) analog-to-digital converter (ADC). Referring to FIG. 3A, there are shown a time diagram 300.

The timing diagram 300 illustrates an example of timing for various signals used by and/or generated in the asynchronous SAR ADC 200, such as during normal (ideal) operations therein. In this regard, the timing diagram 300 may particularly show timing of the global clock signal Clks and the comparator clock signal Ck_comp. The comparator clock signal Ck_comp may drive operations of the comparator 210 (e.g., comparisons being performed when the Ck_comp signal is deasserted). Also shown in the timing diagram 300 is the time of the 'Done' signal, which may be asserted whenever the comparator 210 completes a (bit) comparison.

Also shown in the timing diagram 300 is the timing of each of the internal clock signals generated via the asynchronous clock generator 240 ($Ck_1$-$Ck_N$; with N being the ADC's resolution, and being demonstratively set to 10, thus resulting in 10 clock signals). As shown in timing diagram 300, the internal clock signals $Ck_1$-$Ck_{10}$ may be asserted in sequence—i.e. one after the next (in order), with each internal clock signal $Ck_i$ being asserted after each assertion of the 'Done' signal, with each clock signal remaining asserted until the next assertion of the global clocking signal Clks (when all asserted internal clock signals are deasserted, for the next cycle).

FIG. 3B illustrates an example timing diagram during a possible meta-stability event in a conventional asynchronous successive approximation register (SAR) analog-to-digital converter (ADC). Referring to FIG. 3B, there are shown a time diagram 350.

The timing diagram 350 may illustrate an example of timing for various signals used by and/or generated in the asynchronous SAR ADC 200 during a possible meta-stability event. In this regard, meta-stability may occur when the analog input signal is very close to one of the DAC thresholds (defining discrete values '1' and '0'), thus resulting in the matching operation (e.g., comparison performed by the comparator 210) taking a very long time (e.g., up to the end of the full conversion sequence) to resolve the input in the corresponding cycle (which is known as a meta-stable cycle). In an asynchronous SAR ADC, such as the asynchronous SAR ADC 200, when a meta-stability event occurs, the ADCs may not be able to finish all conversion cycles, thus creating big error which may cause a high bit error rate (BER) in the system even when the signal may still be good—e.g., characterized by high signal-to-noise ratio (SNR). As an example, the timing diagram 350 demonstrates how occurrence of meta-stability in one of the comparison cycles (shown here, as an example, during the 3rd comparison). As shown in timing diagram 350, occurrence of the meta-stability during the 3rd comparison delays assertion of the corresponding internal clock ($Ck_3$), resulting in some of the internal clocks (e.g., $Ck_8$-$Ck_{10}$) not being asserted, and thus the corresponding bits in the digital output (e.g., bits 8-10) not being (possibly) set correctly. In other words, the delay in determining a single bit results in 3 bits (out of 10) being potentially incorrect.

Figure 4:
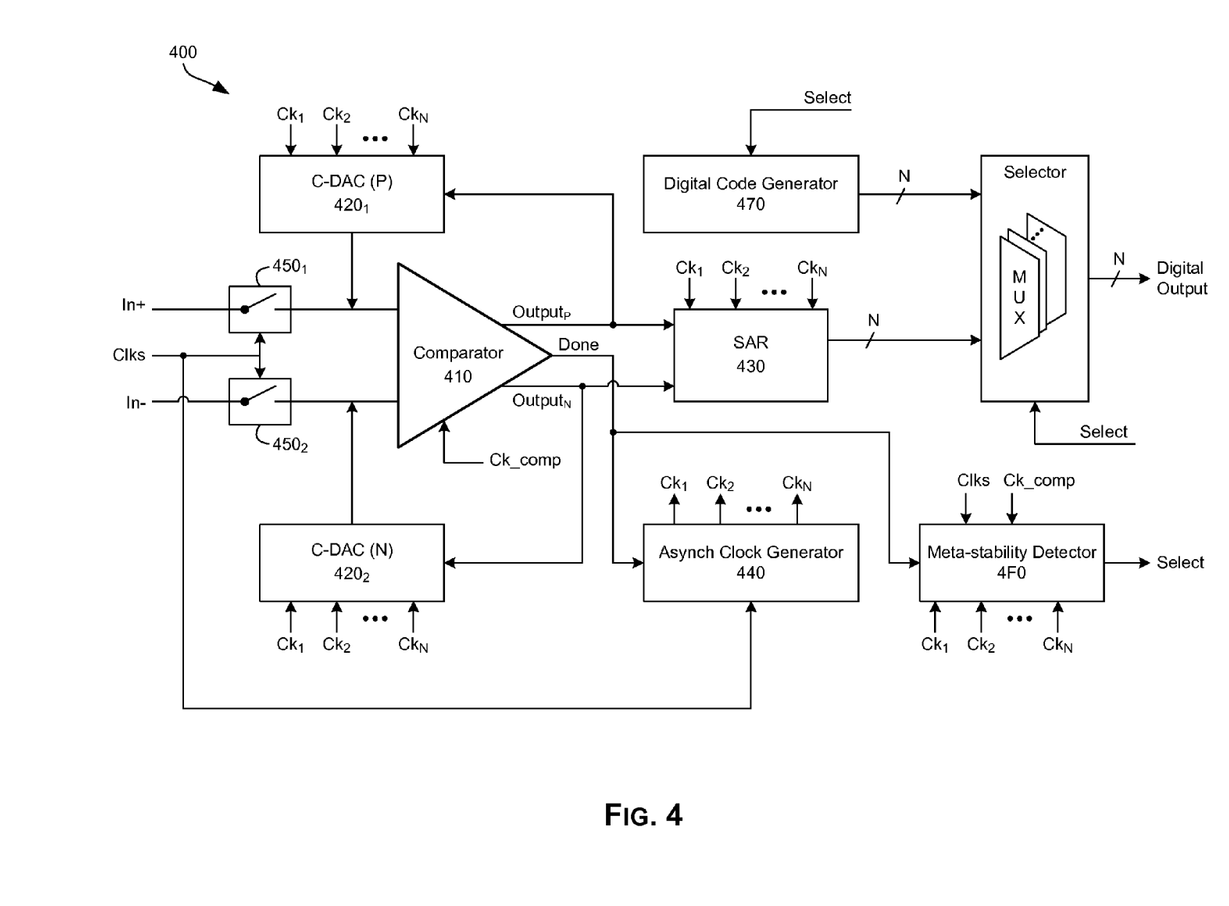
FIG. 4 illustrates an example asynchronous successive approximation register (SAR) analog-to-digital converter (ADC) with meta-stability detection.

FIG. 4 illustrates an example asynchronous successive approximation register (SAR) analog-to-digital converter (ADC) with meta-stability detection. Referring to FIG. 4 there is shown an asynchronous SAR ADC 400.

The asynchronous SAR ADC 400 may be substantially similar to the asynchronous SAR ADC 200, as described with regard to FIG. 2 for example. Accordingly, the asynchronous SAR ADC 400 may also be configured provide analog-to-digital conversions, in accordance with successive approximation techniques, and in an asynchronous manner. For example, asynchronous SAR ADC 400 may comprise comparator 410, negative and positive cascade digital-to-analog convertors (C-DACs) 420$_1$ and 420$_2$, a successive approximation register (SAR) 430, an asynchronous clock generator 440, and switching elements 450$_1$ and 450$_2$. In this regard, each of these elements in the SAR ADC 400 (the comparator 410, the C-DACs 420$_1$ and 420$_2$, the SAR 430, the clock generator 440, and the switching elements 450$_1$ and 450$_2$) may be substantially similar to, and/or may be configured and/or may operate in substantially similar manner as corresponding components of the SAR ADC 200 (the comparator 210, the C-DACs 220$_1$ and 220$_2$, the SAR 230, the clock generator 240, and the switching elements 250$_1$ and 250$_2$), as described with respect to FIG. 2 for example.

The asynchronous SAR ADC 400 may, however, further comprise additional suitable circuitry, interfaces, logic and/or code operable to provide meta-stability detection and/or handling thereof. For example, the asynchronous SAR ADC 400 may also comprise a meta-stability detector 460, a digital code generator 470, and a selection block 480.

The meta-stability detector 460 may comprise circuitry, interfaces, logic and/or code operable to detect occurrence of meta-stability during operations of the asynchronous SAR ADC 400. Furthermore, the meta-stability detector 460 may be configured to generate a control signal (Select) which may control selection of particular bits in the digital output of the asynchronous SAR ADC 400. Specifically, the 'Select' signal may be an N-bit signal, with each of the N bits therein specifying selection of the corresponding bit in the digital output of the asynchronous SAR ADC 400. In some instances, the meta-stability detector 460 may be configured to monitor the clocking signals of the asynchronous SAR ADC 400 (e.g., Clks, Ck_comp, and $Ck_1$-$Ck_N$), and may set the 'Select' signal (or any particular bits therein) based on that monitoring. The 'Select' signal may be sent to, and used in controlling the digital code generator 470 and the selection block 480.

The digital code generator 470 may comprise circuitry, interfaces, logic and/or code operable to generate digital code that may be used as the digital output of the asynchronous SAR ADC 400 (or at least part of it). For example, the output of the digital code generator 470 may be N-bits long, with the N being the resolution of the asynchronous SAR ADC 400 (and thus the size of its digital output). The operations of the digital code generator 470 may be controlled based on the 'Select' control signal issued by the meta-stability detector 460 (e.g., using each bit as set in the 'Select' signal to determine when to assert/deassert the corresponding bit in the output of the digital code generator 470).

The selection block 480 may comprise circuitry, interfaces, logic and/or code operable to select output(s) based on a plurality of inputs. Specifically, the selection block 480 may be configured to select values for each of the N bits in the digital output of the asynchronous SAR ADC 400, by selecting for each $n^{th}$ bit in the digital output, between values of the corresponding ($n^{th}$) bits in each of the outputs of the digital code generator 470 and the SAR 430. The selection operation in the selection block 480 may be controlled based on the 'Select' control signal issued by the meta-stability detector 460 (e.g., using a corresponding bit as set therein). In an example implementation, the selection block 480 may be implemented as a plurality (e.g., equaling the resolution of SAR ADC—i.e., N) of multiplexers (MUXs), with each MUX being used in selecting a specific bit (of the total N bits) in the digital output of the asynchronous SAR ADC 400.

In operation, the SAR ADC 400 may operate to provide analog-to-digital conversions, substantially as described with respect to the SAR ADC 200 of FIG. 2 for example. In this regard, the SAR ADC 400 may be configured to also provide analog-to-digital conversions using asynchronous successive approximation. Unlike the SAR ADC 200, however, the SAR ADC 400 may be operable to handle various error scenarios, including, e.g., meta-stability events. In this regard, the meta-stability detector 460 may be operable to detect meta-stability events, such as based on monitoring of various signals generated and/or used in the SAR ADC 400—e.g., the clocking signals Clks, Ck_comp, and $C_{k1}$-$C_{kN}$, used in clocking various components of the SAR ADC 400 and/or in triggering the various conversion cycles; and the 'Done' signal used to indicate the successful completion of each conversion cycle. The meta-stability detector 460 may generate, based on the monitoring of the various control signal, the 'Select' signal, which may be used in controlling other components of the SAR ADC 400 in a manner that may allow handling of any detected meta-stability event.

For example, the 'Select' signal may be adaptively configured such that the digital code generator 470 may be triggered to generate a particular digital code whenever a meta-stability event is detected, and to cause the selection block 480 to select (i.e., pass as output of the SAR ADC 400) the digital code generated by the digital code generator 470, rather than the output of the SAR 430. In this regard, in some instances, the digital code generated by the digital code generator 470 may correspond to only a portion of the overall (N-length) bit sequence generated periodically by the SAR ADC 400. For example, when a meta-stability event is detected during one of the 'N' conversion cycles, the digital code may only correspond to the remaining portion—i.e. from the 'current' bit through the end of the N-bit sequence, with the prior bits being set based on the actual outcome of the prior conversions. In this regard, the selection block 480 may be made to (e.g., using the 'Select' signal) select the digital code for the portion intended to carry that code in the overall N-bit output of the SAR ADC 400. For example, when the selection block 480 comprises N MUXs, only MUXs corresponding to the bits in the overall output intended to carry the digital code (e.g., bits 4–N) would be set to output from the digital code generator 470, with the remaining MUXs (e.g., MUXs corresponding to bits 1-3) being set to output from the SAR 430.

Figure 6:
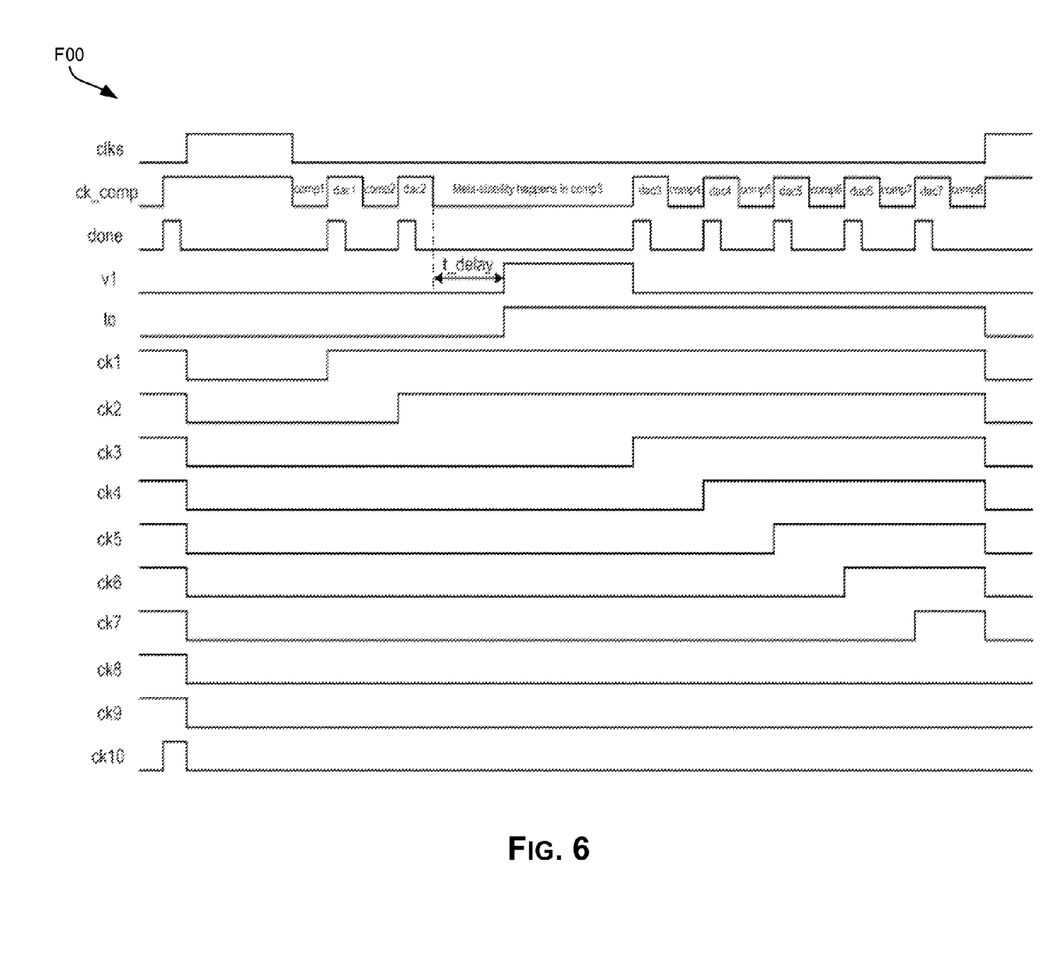
FIG. 6 illustrates an example timing diagram during handling of a meta-stability event in an asynchronous successive approximation register (SAR) analog-to-digital converter (ADC) with meta-stability detection.

The digital codes that the digital code generator 470 generates may be preconfigured. In this regard, in some instances, various digital codes may be predefined—e.g., based on in which cycle conversion the event occurred and/or the outcome of the last successful conversion. FIG. 6 depicts an example timing corresponding to handling of meta-stability event in a SAR ADC implemented in accordance with the present disclosure, such as the SAR ADC 400.

Figure 5:
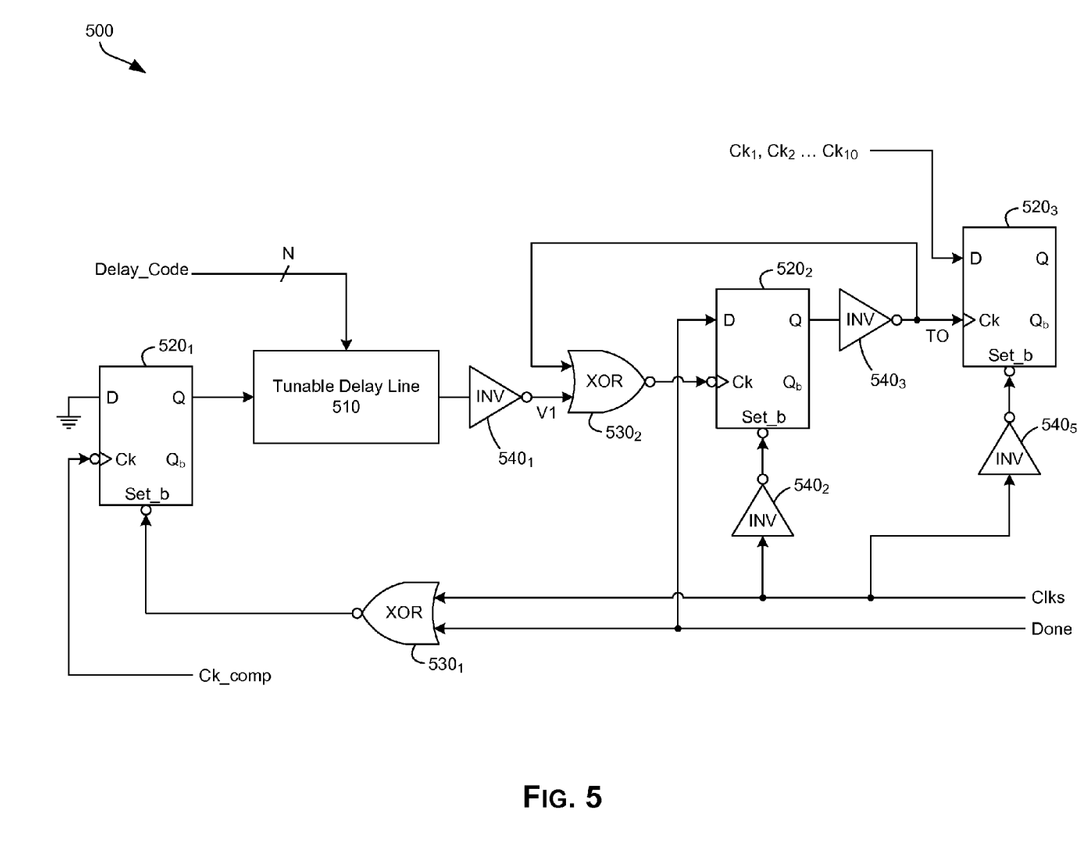
FIG. 5 illustrates an example meta-stability detector in an asynchronous successive approximation register (SAR) analog-to-digital converter (ADC).

FIG. 5 illustrates an example meta-stability detector in an asynchronous successive approximation register (SAR) analog-to-digital converter (ADC). Referring to FIG. 5, there is shown a meta-stability detector 500.

The meta-stability detector 500 may comprise suitable circuitry, interfaces, logic and/or code for providing meta-stability detection (e.g., during analog-to-analog conversions). For example, the meta-stability detector 500 may correspond to the meta-stability detector 460 of FIG. 4. In this regard, the meta-stability detector 500 may represent an example implementation of the meta-stability detection, and/or handling of occurrence thereof, functions in an asynchronous SAR ADC, such as the asynchronous SAR ADC 400. Furthermore, the meta-stability detector 500 as shown is configured to provide meta-stability detection in asynchronous SAR ADC having a resolution of 10 (i.e., the N corresponding to the digital output size, or number of bits therein, is demonstratively set to 10, thus resulting in 10 internal clock signals). It should be understood, however, that the disclosure need not be limited to this implementation and/or any specifics thereof.

The meta-stability detector 500 may comprise, for example, a tunable delay line 510, D flip-flops 520$_1$, 520$_2$ and 520$_3$, XOR gates 530$_1$ and 530$_2$, and invertors 540$_1$, 540$_2$, 540$_3$ and 540$_4$. The components of meta-stability detector 500 may be arranged, for example, in the manner shown in FIG. 5, to provide meta-stability detection. In this regard, the tunable delay line 510 may be utilized as a reference timer, to enable measuring comparison time of comparator for each conversion cycle. The meta-stability detector 500 may be configured to generate a control signal (shown herein as sel<1:10>, since N is 10 in this example), which may control selection of particular bits—e.g., particular bits in the digital output of the asynchronous SAR ADC 400. For example, the sel<1:10> may correspond to the control signal 'select' used in the SAR ADC 400, with each of the 10 bits in the sel<1:10> signal may specify (e.g., by being asserted, or set to '1') generating of the corresponding bit by the digital code generator 470 and the selection thereof from the output of the digital code generator by the selection block 480.

FIG. 6 illustrates an example timing diagram during handling of a meta-stability event in asynchronous successive approximation register (SAR) analog-to-digital converter (ADC) with meta-stability detection.

Referring to FIG. 6, there are shown a time diagram 600. The timing diagram 600 may illustrate example timing for various signals used by and/or generated in the asynchronous SAR ADC 400, during a possible meta-stability event and handling thereof. In this regard, timing diagram 600 may demonstrate an example of occurrence of meta-stability event during one of the comparison cycles (shown here, as an example, during a 3rd comparison), and of how the meta-stability event may be detected and handled. For example, as shown in timing diagram 600, occurrence of the meta-stability during the 3rd comparison delays assertion of the corresponding internal clock ($Ck_3$), resulting in some of the internal clocks (e.g., $Ck_8$-$Ck_{10}$) not being asserted. The occurrence of meta-stability events may be detected by, for example, monitoring each comparison cycle duration against a maximum comparison threshold (t_delay), which may automatically be tuned by a delay-lock-loop (e.g., by asserting the v1 signal). In this regard, the threshold t_delay may be fixed, such as during design and/or initial testing of the system, or it may be configurable to allow for adjustments thereto, such as based on behavior of the system or monitoring thereof.

Accordingly, if any comparison (e.g., the 3rd comparison) time is longer than t_delay, then the time-out (to) signal will be asserted (e.g., by transitioning from logic low to logic high), and the status of $Ck_1$, $Ck_2$, . . . , $Ck_{10}$ may be read. The meta-stability may then be remedied or addressed using the meta-stability detector (500) output, control signal 'Select' (shown in FIGS. 5 and 6 as sel<1:10>) for example. In this regard, the output of meta-stability detector 500, sel<1:10>, may be used to trigger the digital code generator 470 to produce the rest of the bits which is not generated by ADC yet (i.e., not set in the SAR 430). The same bits set in the control signal sel<1:10> to trigger issues the missing bits by the digital code generator 470 may also be used to force the selection block 480 to select the bits set by the digital code generator 470. For example, when the meta-stability occurs in the 3rd conversion cycle, as shown in the time diagram 600, the first two bits of the digital output may have already been obtained from the SAR 430. The rest of 8 bits, D<7:0>, may then be created, using the digital code generator 470, to be 01111111. In this way, the final error of the ADC output will be within one least significant bit (LSB).

Figure 7:
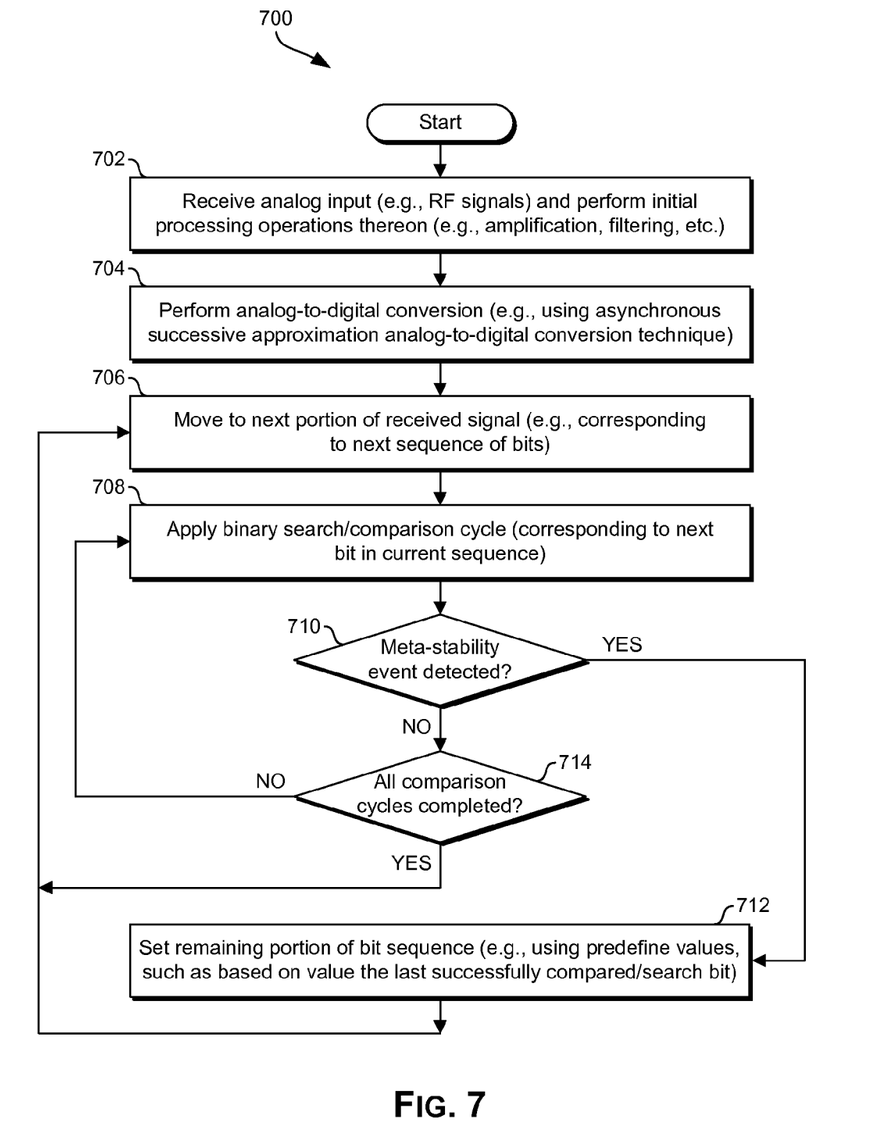
FIG. 7 is a flow chart that illustrates an example process for handling of a meta-stability event during analog-to-digital conversion.

FIG. 7 is a flow chart that illustrates example process for handling of a meta-stability event during analog-to-digital conversion. Referring to FIG. 7, there is shown a flow chart 700 comprising a plurality of example steps that may be performed in system that supports asynchronous successive approximation analog-to-digital conversion with meta-stability detection (e.g., the SAR ADC 400).

In step 702, an analog input (e.g., RF signal) may be received by the system, and initial processing operations (e.g., amplification, filtering, etc.) may be performed on that input (i.e., prior to sampling/analog-to-digital conversion). In step 704, analog-to-digital conversion may be performed on the (partially-processed) analog input. In this regard, the analog-to-digital conversion may be performed using, e.g., asynchronous successive approximation based techniques.

Steps 706-714 represent an example analog-to-digital conversion process based on asynchronous successive approximation. In step 706, an initial (or next) portion of the analog portion (corresponding to next sequence of bits) may be handled. In this regard, the length of bit sequence (in the intended digital output) and accordingly the portion of the analog input to be handled (next) may depend on the resolution of the utilized ADC. For example, for an ADC having resolution of 10, portions of the analog input are selected such that they correspond to 10-bit sequence. In step 708, the binary search/comparison cycle, corresponding to next bit in current sequence (e.g., any one of the N bits) may be applied.

In step 710, it may be determined whether a meta-stability event is detected during the current search/comparison cycle. This may be done based on, for example, monitoring whether the search/conversion lasts beyond a predefined delay threshold (without settling). In instances where it determined that a meta-stability event is detected, the process may proceed to step 712. In step 712, the meta-stability event may be handled. For example, the remaining portion of the bit sequence may be set, such as using predefined values (e.g., based on value the last successfully compared/search bit). The process may then return to step 706, for handling the next (N-bit based) sequence.

Returning to step 710, in instances where it determined that no meta-stability event was detected—e.g., the search/conversion settled before timeout, the process may proceed to step 714. In step 714, it may be determined whether all search/conversion cycle for the current sequence (e.g., all N cycles) have been completed. In instances where it may be determined that not all cycles were completed, the process may loop back to step 708; otherwise the process loops to step 706, for handling the next (N-bit based) sequence.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for asynchronous successive approximation analog-to-digital convertor (ADC) architecture.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method, comprising:
   in signal processing circuitry:
      searching through a plurality of quantization levels for a quantization level that matches an analog input; and
      when said search for said matching quantization level fails within a particular amount of time, adjusting at least a portion of an output of said signal processing circuitry.

2. The method of claim 1, wherein adjusting at least a portion of an output of said signal processing circuitry comprises setting at least said portion of said output of said signal processing circuitry to a predefined value.

3. The method of claim 2, comprising selecting said predefined value based on an outcome of processing in said signal processing circuitry prior to or when said search for said matching quantization level fails.

4. The method of claim 1, comprising selecting, for adjusting at least a portion of an output of said signal processing circuitry, between an output of a normal processing path and an output of a code generation path configured for handling search failures.

5. The method of claim 1, wherein at least said portion of said output comprises a sequence of bits.

6. The method of claim 5, wherein said sequence of bits corresponds to remaining bits in a N-bit output, starting with bit corresponding to the failing in said search for said matching quantization level.

7. The method of claim 6, wherein the value of N is determined, when said signal processing circuitry comprises an analog-to-digital convertor (ADC), based on resolution of said ADC.

8. The method of claim 1, wherein said signal processing circuitry comprises an asynchronous successive approximation register (SAR) analog-to-digital convertor (ADC).

9. The method of claim 1, comprising generating timing information that is used in controlling generating of said output of said signal processing circuitry.

10. The method of claim 9, comprising utilizing said timing information in measuring per-cycle operation time during said searching through said plurality of quantization levels.

11. The system of claim 10, wherein said signal processing circuitry comprises a timing generator circuit that is operable to generate timing information for use in controlling generating said output of said signal processing circuitry.

12. A system, comprising:
signal processing circuitry that is operable to:
search through a plurality of quantization levels for a quantization level that matches an analog input; and
when said search for said matching quantization level fails within a particular amount of time, adjust at least a portion of an output of said signal processing circuitry.

13. The system of claim 12, wherein said signal processing circuitry is operable to set at least said portion of said output of said signal processing circuitry, when adjusting it, to a predefined value.

14. The system of claim 13, wherein said signal processing circuitry comprises a code generator circuit for generating said predefined value.

15. The system of claim 14, wherein said code generator circuit is operable to generate said predefined value based on an outcome of processing in said signal processing circuitry prior to or when said search for said matching quantization level fails.

16. The system of claim 12, wherein said signal processing circuitry comprises a selector circuit for use in setting at least said portion of an output of said signal processing circuitry.

17. The system of claim 16, wherein said selector circuit is operable to select between output of a normal processing path in said signal processing circuitry and an output of a generator circuit that is operable to generate a particular output when searches fail.

18. The system of claim 16, wherein said selector circuit is operable to select on per-bit basis, to enable setting only a sequence of bits, corresponding to a portion of an overall N-bit output, based on said output of said generator circuit.

19. The system of claim 18, wherein the value of N is determined, when said signal processing circuitry comprises an analog-to-digital convertor (ADC), based on resolution of said ADC.

20. The method of claim 19, wherein said signal processing circuitry is operable to utilize said timing information in measuring per-cycle operation time during said searching through said plurality of quantization levels.

* * * * *